(12) United States Patent
Aramaki et al.

(10) Patent No.: US 8,207,524 B2
(45) Date of Patent: Jun. 26, 2012

(54) INSULATING LAYER, ELECTRONIC DEVICE, FIELD EFFECT TRANSISTOR, AND POLYVINYLTHIOPHENOL

(75) Inventors: Shinji Aramaki, Kanagawa (JP); Yoshimasa Sakai, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 525 days.

(21) Appl. No.: 12/376,123

(22) PCT Filed: Aug. 2, 2007

(86) PCT No.: PCT/JP2007/065175
§ 371 (c)(1),
(2), (4) Date: Mar. 24, 2009

(87) PCT Pub. No.: WO2008/016110
PCT Pub. Date: Feb. 7, 2008

(65) Prior Publication Data
US 2010/0001264 A1 Jan. 7, 2010

(30) Foreign Application Priority Data

Aug. 4, 2006 (JP) .................................. 2006-213014

(51) Int. Cl.
*H01L 51/00* (2006.01)
(52) U.S. Cl. ........... 257/40; 257/E51.027; 257/E51.028; 257/E51.031; 526/286
(58) Field of Classification Search ............. 257/40, 257/E51.027, E51.028, E51.029, E51.031; 438/99; 526/286
See application file for complete search history.

(56) References Cited

U.S. PATENT DOCUMENTS 6,232,157 B1    5/2001   Dodabalapur et al.
7,005,674 B2 *  2/2006   Lee et al. .................. 257/40
7,081,210 B2 *  7/2006   Hirai et al. ............ 252/62.3 Q
2004/0065929 A1  4/2004   Koo et al.
(Continued)

FOREIGN PATENT DOCUMENTS

JP    2004 115805    4/2004
(Continued)

OTHER PUBLICATIONS

Fresco et al., "Towards Surface Growth Lithography Using Polymer Bound Photoactive Acid Generators," Journal of Photopolymer Science and Technology, No. 1, pp. 23-26 (2003).*

(Continued)

*Primary Examiner* — James Mitchell
*Assistant Examiner* — Colleen E Snow
(74) *Attorney, Agent, or Firm* — Oblon, Spivak, McClelland, Maier & Neustadt, L.L.P.

(57) ABSTRACT

Provided is an insulating layer that can improve device characteristics of an electronic device including the insulating layer. The insulating layer contains a polymer insulating substance having repeating units represented by the following formula:

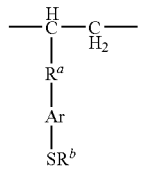

wherein
$R^a$ represents a direct bond or any linking group,
Ar represents a divalent aromatic group optionally having a substituent, and
$R^b$ represents a hydrogen atom, a fluorine atom, or a univalent organic group.

18 Claims, 2 Drawing Sheets

U.S. PATENT DOCUMENTS

2004/0247814 A1* 12/2004 Sirringhaus et al. ......... 428/64.1
2005/0001210 A1 1/2005 Lee et al.

FOREIGN PATENT DOCUMENTS

| | | |
|---|---|---|
| JP | 2005 26698 | 1/2005 |
| JP | 2005 303270 | 10/2005 |
| JP | 2006 245559 | 9/2006 |

OTHER PUBLICATIONS

Choi et al., "Soluble polystyrene-based sulfoxide reagents for Swern oxidation reactions," Tetrahedron 59, pp. 7171-7176 (2003).*

Stewart et al., "Acid catalyst mobility in resist resins," Journal of Vacuum Science Technology B 20(6), pp. 2946-2952 (2002).*

Dujardin et al., "Ion-exchange resins bearing thiol groups to remove mercury. Part 1: synthesis and use of polymers prepared from thioester supported resin," Reactive & Functional Polymers, pp. 123-132 (2000).*

Oskar Nuyken, et al., New Sulfur Containing Polymers 5. Monomer Syntheses, Polymer Bulletin, 11 (2), 1984, pp. 165-170.

Halik, M. et al., "Fully Patterned All-Organic Thin Film Transistors", Applied Physics Letters, vol. 18, No. 2, pp. 289-291 (2002).

* cited by examiner

INSULATING LAYER, ELECTRONIC DEVICE, FIELD EFFECT TRANSISTOR, AND POLYVINYLTHIOPHENOL

TECHNICAL FIELD

The present invention relates to an insulating layer, an electronic device and a field-effect transistor each including the insulating layer, and polyvinylthiophenol, and more specifically relates to an insulating layer that can improve electrical characteristics, an electronic device and a field-effect transistor each including the insulating layer, and polyvinylthiophenol that can be used therefor.

BACKGROUND ART

For example, polyimides, benzocyclobutene, and photoacryl are used as organic insulating layers that are expected as constituents for, organic thin-film transistors or the like. However, such organic insulating layers do not exhibit satisfactory characteristics as devices comparable to inorganic insulating layers (see Patent Document 1). Accordingly, in order to realize organic electronic devices such as organic thin-film transistors, it is demanded to develop organic insulating materials that have excellent characteristics as devices and can be advantageously used in printing processes.

As a reply to this demand for organic insulating materials, recently, an organic insulating layer of a combination of polyvinylphenol and a cross-linking agent has been found (see Non-Patent Document 1).

Furthermore, in Patent Document 2, a polymer of polymerized vinyl cinnamate is used as another material for an organic insulating layer.

Patent Document 1: U.S. Pat. No. 6,232,157
Patent Document 2: Japanese Unexamined Patent Application Publication No. 2005-303270
Non-Patent Document 1: Appl. Phys. Lett., 2002, 81(2), 289

DISCLOSURE OF INVENTION

Problems to Be Solved by the Invention

However, investigation by the present inventors found the following problems:

In the production of an organic thin-film transistor using an organic insulating layer in the form of a combination of polyvinylphenol and a cross-linking agent disclosed in Non-Patent Document 1, an organic semiconductor (organic compound exhibiting semiconductor characteristics) is readily doped with the hydroxyl group of the polyvinylphenol and the reactive group of the cross-linking agent. For this reason, it is found that the organic thin-film transistor having the organic insulating layer disclosed in Non-Patent Document 1 may cause deterioration of device characteristics such as mobility, on/off ratio, and threshold voltage $V_t$.

On the other hand, in the technique disclosed in Patent Document 2, polyvinyl cinnamate does not have polar groups such as a hydroxyl group, unlike polyvinylphenol. Therefore, it is effective for decreasing the threshold voltage $V_t$ by doping to a semiconductor, in a case of insolubilizing polyvinyl cinnamate to organic solvents through cross-linking and using it as an insulating layer of an organic thin-film transistor. However, even in the technique disclosed in Patent Document 2, effects such as the decrease in the threshold voltage $V_t$ are not achieved in organic thin-film transistors produced with semiconductor materials intrinsically having high threshold voltages $V_t$.

Thus, though an organic insulating layer that can improve device characteristics, such as mobility, on/off ratio, and threshold voltage $V_t$, when it is used in an organic thin-film transistor, is desired to be developed, it has not been realized yet. Similarly, such organic insulating layers used in electronic devices other than organic thin-film transistors have not been realized.

Accordingly, in order to solve the problems in the conventional techniques, it is an object of the present invention to provide an insulating layer that can improve device characteristics, an electronic device and a field-effect transistor each including the insulating layer, and polyvinylthiophenol that can be used therefor.

Means for Solving the Problems

The inventors have conducted intensive studies for solving the above-described problems and, as a result, have found that the characteristics, such as mobility, on/off ratio, and threshold voltage $V_t$, of an electronic device such as a field-effect transistor having the insulating layer can be improved by using at least a polyvinyl aromatic thiol and/or a polyvinyl aromatic thioether derivative in an insulating layer. Thus, the present invention has been completed.

That is, an aspect of the present invention relates to an insulating layer containing a polymer insulating substance having at least repeating units represented by the following Formula (A):

[Formula 1]

wherein $R^a$ represents a direct bond or any linking group, Ar represents a divalent aromatic group optionally having a substituent, and $R^b$ represents a hydrogen atom, a fluorine atom, or a univalent organic group (claim 1).

In this aspect, $R^a$ is preferably a direct bond (claim 2).

Furthermore, Ar is preferably a hydrocarbon aromatic ring optionally having a substituent (claim 3).

$R^b$ is preferably a hydrogen atom or a linear or branched hydrocarbon group (claim 4).

The polymer insulating substance preferably has at least repeating units derived from vinylthiophenol and/or a vinylthiophenol derivative (claim 5).

The polymer insulating substance preferably has repeating units derived from a crosslinkable vinyl monomer (claim 6).

The polymer insulating substance preferably has repeating units derived from a heat-resistant vinyl monomer (claim 7).

Furthermore, the insulating layer of the present invention preferably has an electrical conductivity of $1 \times 10^{-12}$ S/cm or less (claim 8).

Another aspect of the present invention relates to an electronic device including the insulating layer of the present invention (claim 9).

Another aspect of the present invention relates to a field-effect transistor including the insulating layer of the present invention (claim 10).

In this aspect, the field-effect transistor of the present invention preferably includes a semiconductor layer containing porphyrin, a source electrode, a drain electrode, and a gate electrode (claim 11).

Another aspect of the present invention relates to polyvinylthiophenol having at least repeating units derived from vinylthiophenol and/or a vinylthiophenol derivative and repeating units derived from a crosslinkable vinyl monomer (claim 12).

Another aspect of the present invention relates to polyvinylthiophenol having at least repeating units derived from vinylthiophenol and/or a vinylthiophenol derivative and repeating units derived from a heat-resistant vinyl monomer (claim 13).

ADVANTAGEOUS EFFECT OF THE INVENTION

The insulating layers of the present invention can improve the characteristics, such as organic field-effect transistors, of an electronic device when the insulating layer is included in the device.

The electronic device of the present invention has improved device characteristics.

The field-effect transistor of the present invention has improved mobility, on/off ratio, and threshold voltage $V_t$.

The polyvinylthiophenol of the present invention can improve the characteristics of electronic devices, such as organic field-effect transistors, including insulating layers using the polyvinylthiophenol.

REFERENCE NUMERALS

Figure 1A:
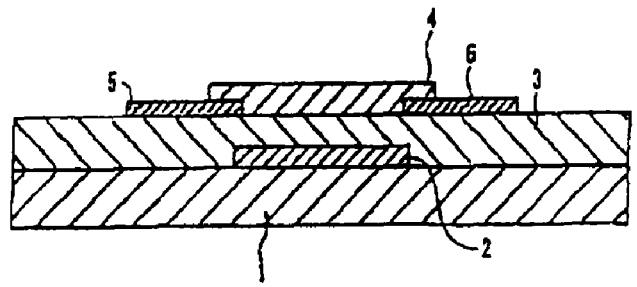
FIGS. 1(A) to 1(D) are each a longitudinal cross-sectional view schematically illustrating a typical structure of a field-effect transistor according to an embodiment of the present invention.

1: supporting substrate
2: gate electrode
3: gate insulating layer (insulating layer)
4: semiconductor layer
5: source electrode
6: drain electrode

BEST MODE FOR CARRYING OUT THE INVENTION

The present invention will now be described with reference to exemplifications and embodiments, but is not limited to the following exemplifications and embodiments, and can be variously modified within the scope of the present invention.

[I. Insulating Layer]

The insulating layer of the present invention contains a polymer insulating substance having at least repeating units represented by the following Formula (A):

wherein $R^a$ represents a direct bond or any linking group, Ar represents an aromatic ring optionally having a substituent, and $R^b$ represents a hydrogen atom, a fluorine atom, or a univalent organic group.

[I-1. Polymer Insulating Substance]

The polymer insulating substance according to the present invention has repeating units represented by Formula (A).

In the Formula (A), $R^a$ represents a direct bond or any linking group. Any linking group can be used as long as the effects of the present invention are not significantly impaired. In particular, preferred are alkylene groups and alkenylene groups that have 1 or more and 6 or less carbon atoms. Among them, $R^a$ is more preferably a direct bond or an alkylene group having 1 or more and 3 or less carbon atoms, more preferably a direct bond or an alkylene group having one or two carbon atoms, and particularly preferably a direct bond.

In Formula (A), Ar represents a divalent aromatic group optionally having a substituent. The divalent aromatic group constituting Ar is not particularly limited as long as the group is divalent and has aromaticity. Accordingly, Ar may be any group having an aromatic ring and may be, for example, an aromatic ring itself or a group formed by binding an aromatic ring and an aliphatic hydrocarbon group. In particular, the aromatic group constituting Ar is preferably an aromatic ring itself and more preferably a hydrocarbon aromatic ring (i.e., arylene group).

Furthermore, Ar may have any substituent that does not significantly impair the effects of the present invention. Examples of the substituent include halogen groups such as a fluoro group; organic groups such as linear, branched, or cyclic alkyl groups having 1 or more and 24 or less carbon atoms, fluorine substituted alkyl groups in which the alkyl groups described above are each substituted with one or more fluoro groups, aryl groups such as a phenyl group, a cyano group, a carboxyl group, and alkoxy groups; nitro groups; amino groups; a sulfonic acid group; and a hydroxyl group. Ar may have a single substituent or any combination of two or more any substituents in any ratio. The number of the substituents may be one or more.

The number of carbon atoms of Ar is not limited as long as the effects of the present invention are not significantly impaired, and is usually 42 or less, preferably 18 or less, and more preferably 14 or less. A larger number of carbon atoms may cause poor solubility. The lower limit is not critical, but is usually 4 or more.

Examples of Ar include those having structures represented by the following Formulae (i) to (xi). These are merely exemplary, and Ar applicable to the present invention is not limited to those having the structures of the following Formulae (i) to (xi).

[Formula 2]

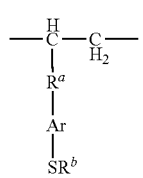

(A)

[Formula 3]

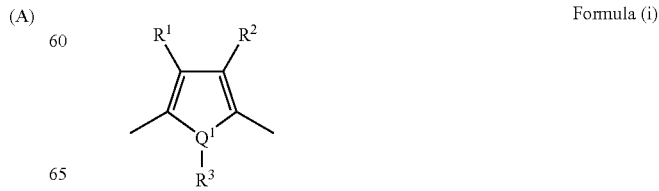

Formula (i)

[Formula 4]

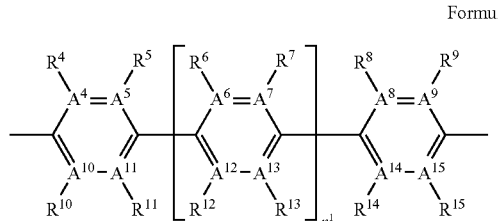

Formula (ii)

[Formula 5]

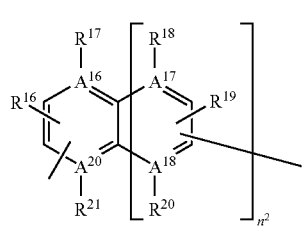

Formula (iii)

[Formula 6]

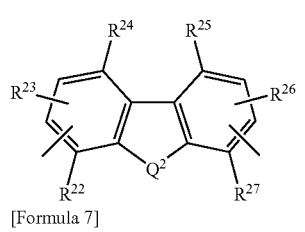

Formula (iv)

[Formula 7]

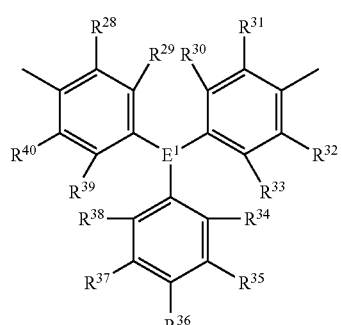

Formula (v)

[Formula 8]

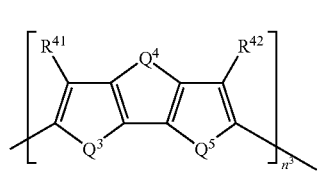

Formula (vi)

[Formula 9]

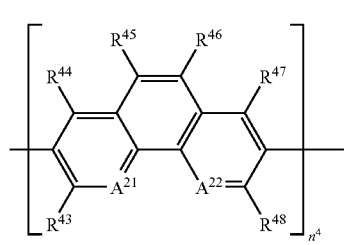

Formula (vii)

[Formula 10]

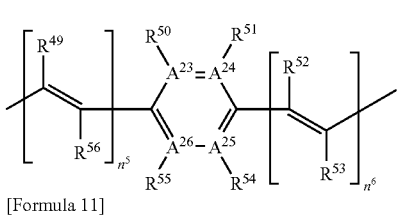

Formula (viii)

[Formula 11]

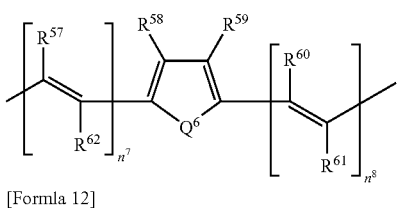

Formula (ix)

[Formula 12]

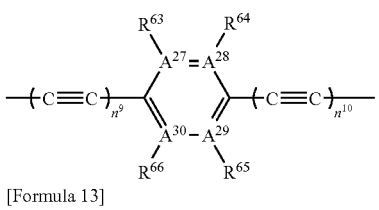

Formula (x)

[Formula 13]

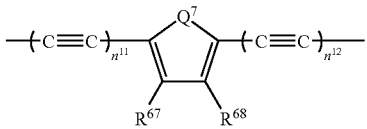

Formula (xi)

In the above Formulae (i) to (xi), the definition of each symbol is as follows:

$R^1$ to $R^{68}$ each independently represent H, F, $CH_3-$, $CH_3(CH_2)_n-$ (n represents an integer of 1 or more and 23 or less), $CH_3(CH_2)_n(CF_2)_m-$ (n and m each independently represent an integer of 1 or more and 23 or less), $CF_3-$, $CF_3(CF_2)_n-$ (n represents an integer of 1 or more and 23 or less), $CF_3(CH_2)_n(CF_2)_m-$ (n and m each independently represent an integer of 1 or more and 23 or less), a phenyl group, a nitro group, an amino group, a cyano group, a carboxyl group, a sulfonic acid group, a hydroxyl group, or an alkoxy group.

$A^4$ to $A^{18}$ and $A^{20}$ to $A^{30}$ each independently represent a carbon atom or a nitrogen atom.

$Q^1$ to $Q^7$ each independently represent $-CR^{69}R^{70}-$, $-NR^{71}-$, $-N-$, $-S-$, $-SiR^{72}R^{72}-$, or $-Se-$ ($R^{69}$ to $R^{73}$ each independently represent a hydrogen atom, a linear, branched, or cyclic alkyl group having 1 or more and 23 or less carbon atoms, or a fluorine substituted alkyl group in which the alkyl group is substituted with one or more fluorine atoms).

$E^1$ represents a nitrogen atom or

[Formula 14]

$n^1$ and $n^2$ each independently represent an integer of 0 or more and 6 or less.

$n^3$ and $n^4$ each independently represent an integer of 1 or more and 8 or less.

$n^5$ and n each independently represent an integer of 0 to 10.

Among the above-mentioned examples, particularly preferred are those represented by Formula (iii): phenylene groups having an $n^2$ of 0, naphthalene groups having an $n^2$ of 1, and anthracene groups having an $n^2$ of 3. Among them, phenylene groups and naphthalene groups are particularly preferred.

In the above Formula (A), $R^b$ represents a hydrogen atom, a fluorine atom, or a univalent organic group. Among them, preferred is a hydrogen atom or a linear or branched hydrocarbon group.

Preferred examples of the univalent organic group include alkyl groups that may be substituted with fluorine atoms, such as $CH_3$—, $CH_3(CH_2)_n$— (n is an integer of 1 or more and 23 or less), $CH_3(CH_2)_n(CF_2)_m$— (n and m are each independently an integer of 1 or more and 23 or less), $CF_3$—, $CF_3(CF_2)_n$— (n is an integer of 1 or more and 23 or less), $CF_3(CH_2)_n(CF_2)_m$— (n and m are each independently an integer of 1 or more and 23 or less); a phenyl group; and carboxyl groups that are each substituted with a hydrocarbon group having 6 or less carbon atoms. Among them, $R^b$ is particularly preferably a hydrogen atom, $CH_3$—, $CF_3$—, $CH_3(CH_2)_n$— (n is an integer of 1 or more and 23 or less), or a carboxyl group substituted with 6 or less carbon atoms, and among them, still more preferably a hydrogen atom, $CH_3$—, $CH_3(CH_2)_n$— (n is an integer of 1 or more and 23 or less), or a carboxyl group substituted with 6 or less carbon atoms.

The repeating unit represented by Formula (A) is derived from a vinyl compound represented by Formula (B) shown below. The polymer insulating substance according to the present invention is therefore a polyvinyl aromatic thiol and/or a polyvinyl aromatic thioether derivative having repeating units derived from a vinyl compound represented by Formula (B) shown below, in terms of monomer. In the following Formula (B), $R^a$, Ar, and $R^b$ are the same as those in Formula (A).

[Formula 15]

(B)

Among the polymer insulating substances according to the present invention, preferred are those having at least repeating units of which Ar in Formula (A) is a phenylene group optionally having a substituent. That is, the polymer insulating substance according to the present invention preferably has at least one of the repeating units derived from vinylthiophenol, vinylthioether, or derivatives thereof. Among them, preferred are those having repeating units derived from a compound having a structure represented by the following Formula (I):

[Formula 16]

(I)

In Formula (I), each R independently represents a hydrogen atom or a fluorine atom, and i represents an integer of 1 or more and 5 or less, and preferably 3 or less. When all R are hydrogen atoms, Formula (I) represents vinylthiophenol. When at least one R is fluorine, Formula (I) represents a vinylthiophenol derivative. $R^c$ represents a hydrogen atom or an alkyl group having 6 or less carbon atoms.

As described above, the polymer insulating substance according to the present invention has a structural unit represented by Formula (A) and therefore has an aromatic thiol group and/or an aromatic thioether group. For this reason, the insulating layer of the present invention can improve device characteristics. In particular, the degree of the improvement is large when Ar in Formula (A) is a phenylene group optionally having a substituent. Furthermore, among these polymer insulating substances of the present invention, those having repeating units derived from vinylthiophenol and/or a vinylthiophenol derivative (i.e., repeating units represented by Formula (A) of which Ar is a phenylene group optionally having a substituent and $R^b$ is a hydrogen atom, and hereinafter optionally referred to as "vinylthiophenol/derivative unit") are preferred due to significant improvements in the above-mentioned characteristics.

The mechanism for achieving the above-mentioned advantages by having the structural unit represented by Formula (A) is not clear. However, the investigation of the present inventors suggests that an aromatic thiol group or an aromatic thioether group can remove excess and inherent carriers present in an organic semiconductor and, thereby, the insulating layer of the present invention can effectively decrease the threshold voltage $V_t$ and improves the on/off ratio. In principle, the same effect can be expected when a reducing functional group is used instead of the aromatic thiol group or the aromatic thioether group. However, when, for example, an amino group is used as the reducing functional group, the amino group functions as a carrier trap that removes excess number of carries. This may cause a substantial decrease in threshold voltage $V_t$. In contrast, the thiol group is out of such concern, and it can effectively improve device characteristics.

The repeating units represented by Formula (A) may be used a single kind or any combination of two or more kinds at any ratio. Accordingly, when a polymer insulating substance according to the present invention is produced, the monomers corresponding to the repeating units (i.e., a compound represented by Formula (B) or (I)) may be used a single kind or any combination of two or more kinds at any ratio.

The repeating units represented by Formula (A) in the polymer insulating substance according to the present invention may be present in mole fraction that does not significantly impair the effects of the present invention, and the mole fraction is usually 0.1 or more, preferably 0.2 or more, and more preferably 0.3 or more and usually 1 or less, preferably 0.7 or less, and more preferably 0.5 or less. A smaller mole fraction of the repeating units represented by Formula (A) may cause high threshold voltage $V_t$. When the polymerization ratio is less than 1, the polymer insulating substance according to the present invention is a copolymer. The mole fraction can be measured by determining the ratio of the $SR^b$ group by $^1$H-NMR.

The polymer insulating substance according to the present invention may be a homopolymer of a vinyl compound represented by Formula (B) or may be a copolymerized polymer having another repeating unit. The polymer insulating substance according to the present invention may have any repeating unit that does not significantly impair the effects of the present invention, other than the repeating units represented by Formula (A), without particular limitation. In particular, preferred are a repeating unit derived from a crosslinkable vinyl monomer (hereinafter, optionally referred to as "crosslinkable vinyl monomer unit") and a repeating unit derived from a heat-resistant vinyl monomer (hereinafter, optionally referred to as "heat-resistant vinyl monomer unit").

The crosslinkable vinyl monomer corresponding to the crosslinkable vinyl monomer unit has a vinyl group, which has a carbon-carbon double bond in the side chain after it is copolymerized. In this crosslinkable vinyl monomer, the carbon-carbon double bond induces a cyclization dimerization by irradiation with light or heat to form cross-link by an alicyclic hydrocarbon group.

The structure of the crosslinkable vinyl monomer is not specifically limited, but preferred are vinyl monomers having side chains having structures of the following Formulae (II) to (V):

[Formula 17]

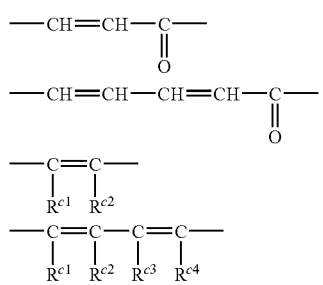

In Formulae (IV) and (V), $R^{c1}$, $R^{c2}$, $R^{c3}$, and $R^{c4}$ each independently represent an aliphatic hydrocarbon group, a cyano group, or a hydrogen atom.

Among these side chains, preferred are those having structures represented by Formula (II) and (III), and examples thereof include a 2-propenoic acid group, a 3-phenylpropenoic acid group (cinnamoyl group), a 2,4-pentadienoic acid group, and a 6-phenyl-2,4-pentadienoic acid group. Among them, a 3-phenylpropenoic acid group (cinnamoyl group) and a 6-phenyl-2,4-pentadienoic acid group are preferred, and a 3-phenylpropenoic acid group (cinnamoyl group) is particularly preferred.

Preferred examples of the crosslinkable vinyl monomer include vinyl 3-phenylpropenoate and vinyl 6-phenyl-2,4-pentadienoate, and among them, vinyl 3-phenylpropenoate is particularly preferred.

Since the above-mentioned crosslinkable vinyl monomer has a carbon-carbon double bond in the side chain, a crosslinkable vinyl monomer is cross-linked to another crosslinkable vinyl monomer by their side chains. Accordingly, for example, as shown in Formula (VI) below, a cyclobutylene group is generated by dimerization cyclization of side chains having a structure represented by the above Formula (II) or (IV). Alternatively, as shown in Formula (VII) below, a cyclohexenylene group is generated by dimerization cyclization of a side chain having a structure represented by the above Formula (II) or (IV) and a side chain having a structure represented by Formula (III) or (V). Thus, in the crosslinkable vinyl monomer unit, a cross-linked skeleton corresponding to the structure of a crosslinkable vinyl monomer is formed by the cyclization reaction described above. The cyclization reaction described above is generally induced by light or heat and is preferably by light.

[Formula 18]

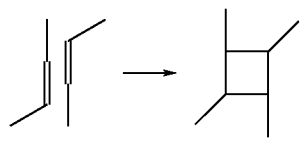

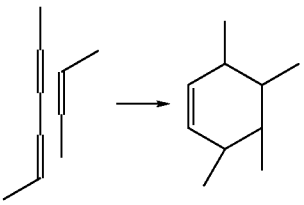

The insulating layer of the present invention has a cross-linked skeleton and thereby can be suitably applied to an electronic device employing an organic material, such as an organic thin-film transistor. For example, in the case that an organic thin-film transistor is formed by a solution process, an organic semiconductor layer comes into contact with an organic insulating layer at their interface. The organic insulating layer will be damaged by the organic solvent with high probability. However, the insulating layer of the present invention is insoluble in the organic solvent used for forming the organic semiconductor layer, since it has the cross-linked skeleton. The organic insulating layer of the present invention is therefore less damaged by the solution process. Thus, the insulating layer of the present invention is very effective.

The properties of the insulating layer of the present invention may change depending on the type of the cross-linked skeleton. For example, if the cross-linked skeleton is formed by a cross-linking reaction of polyvinylphenol or the like, which has a polar group such as a hydroxyl group, the use of the insulating layer (sic) in an electronic device may cause a change in the threshold voltage $V_t$ with doping of a semiconductor. Accordingly, this insulating layer is unpreferable as a constituent of the electronic device (in particular, organic thin-film transistor). However, since using a cross-linked skeleton obtained from a crosslinkable vinyl monomer suppresses such a change in the threshold voltage $V_t$, the insulating layer of the present invention can be preferably applied to an electronic device.

The advantages obtained by the use of combination of the crosslinkable vinyl monomer unit described above are particularly significant when the polymer insulating substance of the present invention contains vinylthiophenol/derivative unit as the repeating unit represented by Formula (A). Therefore, the polyvinylthiophenol having at least a vinylthiophenol/derivative unit and a crosslinkable vinyl monomer unit is a remarkably excellent structural material of the insulating layer.

The crosslinkable vinyl monomers may be used a single kind or any combination of two or more kinds at any ratio. Therefore, the crosslinkable vinyl monomer units of the polymer insulating substance according to the present invention may be used a single kind or any combination of two or more kinds at any ratio.

When the polymer insulating substance according to the present invention has a crosslinkable vinyl monomer unit, the mole fraction of the crosslinkable vinyl monomer unit in the polymer insulating substance according to the present invention is not limited, but is usually 0.1 or more, preferably 0.4 or more, and more preferably 0.5 or more and usually 0.9 or less, preferably 0.8 or less, and more preferably 0.7 or less. A smaller mole fraction of the crosslinkable vinyl monomer unit may cause insufficient advantages derived from the crosslinkable vinyl monomer unit and a decreased crosslink density, which loses the insolubility effect of the insulating substance in organic solvents. A larger mole fraction of the crosslinkable vinyl monomer unit may decrease the effect of the thiol group (i.e., removal of excess carriers in the organic semiconductor). The mole fraction can be measured by $^1$H-NMR.

On the other hand, the heat-resistant vinyl monomer corresponding to the heat-resistant vinyl monomer unit has a vinyl group and has a certain heat resistance. Throughout the description, the heat resistance is defined as that a homopolymer having a number average molecular weight of 1000 prepared from a heat-resistant vinyl monomer has a glass transition temperature Tg of 140° C. or more.

The structure of the heat-resistant vinyl monomer is not specifically limited, but preferably has a heat-resistant skeleton obtained from maleic anhydride and an amine. Particularly preferred are maleimides. Preferred examples of maleimides include those having a structure represented by the following Formula (VIII):

[Formula 19]

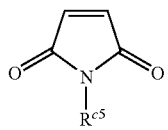

(VIII)

In the above Formula (VIII), $R^{c5}$ represents a hydrogen atom or a group represented by the following Formula (IX):

[Formula 20]

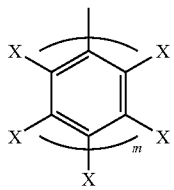

(IX)

In the above Formula (IX), each X independently represents a hydrogen atom, a fluorine atom, or a nitro group, and preferably a hydrogen atom or a fluorine atom, and m represents an integer of 1 or more, preferably 2 or more, and more preferably 3 or more and 10 or less, preferably 8 or less, and more preferably 6 or less.

Among maleimides having a structure of Formula (VIII), particularly preferred are those in the case of $R^{c5}$ being a phenyl group, because the phenyl group does not have polar groups and provides steric hindrance to the nitrogen atom of the imide group to reduce the influence of the nitrogen atom. Since a reduction of the influence of the nitrogen atom being reducing group allows the threshold voltage $V_t$ to be stabilized to about 0.

The polymer insulating substance according to the present invention having such a heat-resistant vinyl monomer unit exhibits improved heat resistance. Specifically, the polymer insulating substance according to the present invention can have a glass transition temperature of usually 120° C. or more, preferably 150° C. or more, and more preferably 180° C. or more. Since electronic devices may generate heat in use, the insulating layer must have heat resistance. The heat resistance of the insulating layer of the present invention is improved by the use of a highly heat-resistant polymer insulating substance according to the present invention. Consequently, the electronic device can be stably operated.

The advantages obtained by the use of combination of the above-mentioned heat-resistant vinyl monomer unit are particularly significant when the polymer insulating substance of the present invention contains a vinylthiophenol/derivative unit as the repeating units represented by Formula (A). Consequently, the polyvinylthiophenol having at least a vinylthiophenol/derivative unit and a heat-resistant vinyl monomer unit is a remarkably excellent structural material of the insulating layer.

The heat-resistant vinyl monomers may be used a single kind or any combination of two or more kinds at any ratio. The heat-resistant vinyl monomer units in the polymer insulating substance according to the present invention may be used a single kind or any combination of two or more kinds at any ratio.

When the polymer insulating substance according to the present invention has a heat-resistant vinyl monomer unit, the mole fraction of the heat-resistant vinyl monomer unit in the polymer insulating substance according to the present invention is not limited and is usually more than 0, preferably 0.05 or more, and more preferably 0.1 or more and usually 0.5 or less, preferably 0.4 or less, and more preferably 0.3 or less. A smaller mole fraction of the heat-resistant vinyl monomer unit may insufficiently achieve the advantages by using the heat-resistant vinyl monomer unit and may provide insufficient heat resistance. A larger mole fraction may cause trap of the carriers of a semiconductor by the nitrogen atom of the imide group. When the polymer insulating substance according to the present invention has a large number of the crosslinkable vinyl monomer units, the heat resistance is enhanced with the crosslink density. Accordingly, in some cases, sufficient heat resistance can be achieved without using the heat-resistant vinyl monomer unit. The mole fraction can be measured by $^1$H-NMR.

The polymer insulating substance according to the present invention may have repeating units other than the repeating units represented by Formula (A), the crosslinkable vinyl monomer unit, and the heat-resistant vinyl monomer unit.

However, it is preferable that the repeating units contained in the polymer insulating substance according to the present invention do not have polar groups. Even if the repeating units contained in the polymer insulating substance according to the present invention have polar groups, it is preferable that the number of the polar groups be small. Specifically, the average number of the polar groups per repeating unit contained in the polymer insulating substance according to the present invention is preferably 1 or less, more preferably 0.5 or less, and still more preferably 0.4 or less. When the polymer insulating substance contained in the insulating layer of the present invention has a large number of polar groups, moisture is readily trapped in the insulating layer and the layer surface. Consequently, for example, the moisture causes doping of a semiconductor layer or the like, adjacent to the insulating layer, which may lead to an increase in off-current or a change in threshold voltage $V_t$.

Furthermore, in the case that the polymer insulating substance according to the present invention is a copolymer, the copolymer can be of any type a random copolymer, an alternating copolymer, a block copolymer, a graft copolymer or the like. Among them, preferred are the alternating copolymer and the random copolymer because SR groups in the copolymer are uniformly dispersed.

Preferred examples of the polymer insulating substance according to the present invention include those having the structures represented by the following Formula (X):

[Formula 21]

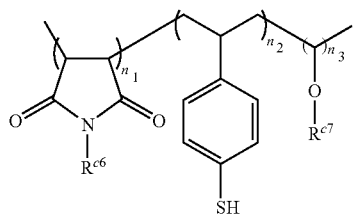

(X)

In the above Formula (X), $R^{c6}$ is the same as $R^{c5}$ described in Formula (VIII), and $R^{c7}$ represents a side chain having a structure represented by any of structures (II) to (V). In addition, $n_1:n_2:n_3$ is 0.1:0.3:0.6. In the above Formula (X), parentheses represent repeating units, and the binding order of these repeating units is not limited to that shown in the formula.

The polymer insulating substance of the present invention may have any weight-average molecular weight that does not significantly impair the effects of the present invention, and the weight-average molecular weight is preferably 5000 or more and more preferably 10000 or more and preferably 1000000 or less and more preferably 100000 or less. A smaller weight-average molecular weight may cause the film-forming ability and insulation properties of the insulating layer of the present invention to be unsatisfactory. A larger weight-average molecular weight may lead to an increase in the viscosity of a solution containing the polymer insulating substance of the present invention, inhibiting formation of a thin film.

The polymer insulating substance of the present invention may be produced by any method, for example, by polymerization of a vinyl compound represented by Formula (B). When $R^b$ is a hydrogen atom, that is, when $SR^b$ is a thiol group, the polymer insulating substance can be produced by previously protecting the thiol group and deprotecting the group after the polymerization. Since a thiophenol group readily generates dissociated radicals, a polymer may not be produced in the presence of the thiophenol groups. However, use of a protecting group ensures stable polymerization. This method will now be described in detail with reference to an exemplary production of polyvinylthiophenol, as the polymer insulating substance according to the present invention, from vinylthiophenol and/or a vinylthiophenol derivative.

First, vinylthiophenol and/or a vinylthiophenol derivative is prepared as a monomer, and then the thiophenol group is protected with a protecting group (protection process). Any protecting group that can protect the thiophenol group can be used, and preferred examples thereof include the acetyl group and the t-butoxycarbonyl group (t-BOC group). The protecting groups may be used a single kind or any combination of two or more kinds at any ratio. The protection process is not limited. For example, in the protection with an acetyl group, the thiol group is treated with a base and then is reacted with an acid chloride such as acetyl chloride.

After the protection of the thiophenol group, polymerization is conducted in a reaction solvent under a certain reaction condition (polymerization process).

Any reaction solvent that does not inhibit the polymerization can be used. In general, organic solvents are used, and solvents that are usually used in polymerization of vinyl polymers, such as tetrahydrofuran and toluene, are preferably used. The reaction solvents may be used a single kind or any combination of two or more kinds at any ratio.

The concentration of the monomer in the reaction solvent is not limited as long as the polymerization proceeds, and is usually 0.001 mol/L or more, preferably 0.002 mol/L or more, and more preferably 0.003 mol/L or more and usually 100 mol/L or less, preferably 80 mol/L or less, and more preferably 60 mol/L or less. A lower concentration of the monomer in the reaction solvent may lead to production of a polymer with a lower molecular weight, and a higher concentration may lead to production of a polymer with a higher molecular weight.

The temperature for polymerization is not limited as long as the polymerization proceeds, and is usually 25° C. or more, preferably 30° C. or more, and more preferably 35° C. or more and usually 150° C. or less, preferably 140° C. or less, and more preferably 130° C. or less. A lower reaction temperature does not cause a proceeding of polymerization, and a desirable polymer may not be obtained. On the other hand, a higher reaction temperature causes boiling of the solvent, and, thereby, a desired copolymerization ratio may not be obtained.

The reaction time is not limited and is usually 1 hour or more, preferably 3 hours or more, and more preferably 5 hours or more and usually 24 hours or less, preferably 20 hours or less, and more preferably 18 hours or less. A shorter reaction time may produce a polymer with a lower molecular weight, and a longer reaction time may produce a polymer with a higher molecular weight.

The preferred atmosphere for the reaction is an inactive atmosphere, for example, a nitrogen atmosphere or vacuum sealing.

Furthermore, any polymerization initiator can be used as long as the polymerization proceeds, and examples thereof include azobisisobutyronitrile (AIBN) and benzoyl peroxide (BPO). The polymerization initiators may be used a single kind or any combination of two or more kinds at any ratio. The amount of the initiator used is not limited, but is usually 0.01 mol % or more and preferably 0.02 mol % or more and usually 10 mol % or less and preferably 8 mol % or less in the reaction solution.

Polyvinylthiophenol having repeating units other than the repeating units represented by Formula (A) can be produced by addition of a monomer (for example, a crosslinkable vinyl monomer or a heat-resistant vinyl monomer) corresponding to the repeating units to the reaction solvent. Accordingly, the polymer insulating substance according to the present invention can have a crosslinkable vinyl monomer unit by using a reaction solvent containing a crosslinkable vinyl monomer, and the polymer insulating substance according to the present invention can have a heat-resistant vinyl monomer unit by using a reaction solvent containing a heat-resistant vinyl monomer. The use of such reaction solvents facilitates copolymerization of vinylthiophenol and/or a vinylthiophenol derivative and another monomer such as a crosslinkable vinyl monomer or a heat-resistant vinyl monomer (copolymerization process).

In the copolymerization, the amounts of the crosslinkable vinyl monomer and the heat-resistant vinyl monomer in the reaction solvent is set to be to the same as the mole fraction of the crosslinkable vinyl monomer unit and the heat-resistant vinyl monomer unit, respectively, in the polymer insulating substance according to the present invention.

The reaction condition for the copolymerization may be the same as that for single polymerization of vinylthiophenol and/or a vinylthiophenol derivative. However, a crosslinkable monomer is preferably copolymerized under a light-shielding condition to avoid a photoreaction of the crosslinkable portion, such as silicic acid.

After the polymerization, the protecting group for the thiophenol group is removed to give polyvinylthiophenol as the polymer insulating substance according to the present invention (deprotection process). The deprotection may be conducted by any method. For example, the polymer obtained by the polymerization is treated with a base such as sodium hydroxide, and then hydrochloric acid is added thereto to give thiol. If this deprotection is not performed, a polymer insulating substance $R^b$ having the protecting group can be obtained.

In general, after the deprotection, purification is conducted (purification process). The method of the purification is not limited. For example, the purification can be performed by reprecipitation with a purification solvent such as hexane or methanol and washing with a washing solvent such as methanol. Preferred method of washing is Soxhlet washing.

When the polymer insulating substance according to the present invention produced by such a method is polyvinylthiophenol, the yield is usually 60% or more, preferably 70% or more, and more preferably 80% or more. The upper limit of the yield is identically 100%, but actually 98% or less.

When the polymer insulating substance according to the present invention produced is not polyvinylthiophenol, the target polymer insulating substance can be produced in a similar manner using an appropriate monomer and under optimized conditions of each process.

In the method described above, the polymer insulating substance of the present invention is produced from a monomer, but may be produced through homopolymerization of an oligomer prepared from the monomer or copolymerization of the oligomer with the monomer.

[I-2. Physical Properties of Insulating Layer]

The insulating layer of the present invention can have any electrical conductivity depending on the use. The electrical conductivity is usually $1 \times 10^{-12}$ S/cm or less, preferably $1 \times 10^{-13}$ S/cm or less, and more preferably $1 \times 10^{-14}$ S/cm or less. A larger electrical conductivity may cause an increased leak current in a transistor including the insulating layer of the present invention. Although the electrical conductivity has no lower limitation, it is usually $1 \times 10^{-16}$ S/cm or more. The electrical conductivity can be measured by current-voltage measurement.

The thickness of the insulating layer of the present invention can be appropriately determined depending on the use without limitation, and is usually 10 nm or more, preferably 50 nm or more, and more preferably 100 nm or more and usually 3 μm or less, preferably 2 μm or less, and more preferably 1 μm or less. A smaller thickness of the insulating layer of the present invention may cause an increased leak current in a transistor including the insulating layer of the present invention, and a larger thickness may cause an insufficient drain current in a transistor including the insulating layer of the present invention.

[I-3. Formation of Insulating Layer]

The insulating layer of the present invention may be formed by any method, for example, by printing, spin-coating, or dipping. Specifically, the insulating layer can be formed as follows:

First, a polymer insulating substance according to the present invention is dissolved in a proper solvent to prepare a coating liquid. This coating liquid is applied to a portion for forming an insulating layer by, for example, the above-mentioned method, and then the solvent is removed by drying or the like. Thus, the insulating layer can be formed.

Any solvent, which dissolve the polymer insulating substance according to the present invention, can be used for preparing the coating liquid. A typical example of such a solvent is dimethylformamide. The solvents may be used a single kind or any combination of two or more kinds at any ratio.

The concentration of the polymer insulating substance in the coating liquid is not particularly limited, and is usually 1 wt % or more, preferably 3 wt % or more, and more preferably 5 wt % or more and usually 50 wt % or less, preferably 30 wt % or less, and more preferably 20 wt % or less. A lower concentration of the polymer insulating substance may make it difficult to remove the solvent, and a higher concentration may increase the viscosity, resulting in poor film-forming properties.

The coating liquid may be dried by heating, evacuation, or heating with evacuation. The conditions such as temperature, pressure, and drying time are not limited. The temperature is usually higher than the boiling point of the solvent used, specifically, usually 50° C. or more, preferably 80° C. or more, and more preferably 100° C. or more and usually 300° C. or less, preferably 250° C. or less, and more preferably 200° C. or less. The pressure is usually 1 Pa or more, preferably 5 Pa or more, and more preferably 10 Pa or more and usually $10^5$ Pa or less, preferably $10^4$ Pa or less, and more preferably $10^3$ Pa or less. The drying time is usually 3 minutes or more, preferably 5 minutes or more, and more preferably 10 minutes or more and usually 120 minutes or less, preferably 90 minutes or less, and more preferably 60 minutes or less.

When the polymer insulating substance according to the present invention having a crosslinkable vinyl monomer unit is cross-linked, the polymer insulating substance according to the present invention may not be dissolved in a solvent. As a result, an insulating layer cannot be formed through the coating process. Therefore, in the case of the polymer insulating substance according to the present invention having a crosslinkable vinyl monomer unit, it is preferable that cross-linking is not performed before the application of the coating liquid, but is performed after the application of the coating liquid. If the polymer insulating substance according to the present invention is a liquid before it is cross-linked, an insulating layer may be formed by directly applying the polymer insulating substance without a solvent and then hardening the polymer insulating substance by cross-linking. The cross-linking may be performed by irradiation with light or heat as described above.

[I-4. Effect of Insulating Layer of the Present Invention]

The characteristics of electronic devices can be improved by using the insulating layer of the present invention.

For example, when an electronic device, such as a field-effect transistor including a semiconductor layer, includes an insulating layer of the present invention, the mobility of the charge in the semiconductor is usually $10^{-5}$ cm$^2$/Vs or more, preferably $10^{-3}$ cm$^2$/Vs or more, and more preferably $10^{-2}$ cm$^2$/Vs or more. The upper limit is not critical, but is usually 10000 cm$^2$/Vs or less. The mobility can be measured by a usual semiconductor measurement system.

For example, a transistor including the insulating layer of the present invention has an on/off ratio of usually 100 or more, preferably 1000 or more, and more preferably 10000 or more. The upper limit is not critical, but is usually $10^8$ or less. The on/off ratio can be measured by a common semiconductor measurement system.

Moreover, for example, a transistor including the insulating layer of the present invention has a threshold voltage $V_t$ of usually ±20 or less, preferably 10 or less, and more preferably ±5 or less. The threshold voltage $V_t$ can be measured by a usual semiconductor measurement system.

In addition, the insulating layer of the present invention may contain a component other than the polymer insulating substance according to the present invention as long as the effects of the present invention are not significantly impaired.

[II. Electronic Device]

The insulating layer of the present invention can be applied to any electronic device including an insulating layer, in particular, an electronic device including an organic semiconductor. Examples of the electronic device include transistors. The inventive insulating layer is preferably applied to transistors, in particular, to organic thin-film transistors. In particular, the insulating layer is preferably applied to a field-effect transistor (FET) according to functional classification. As an example of the electronic device including the insulating layer of the present invention, a field-effect transistor will now be described. However, the structures of the electronic device of the present invention and the field-effect transistor are not limited to the following examples. Any structure can be employed as long as the insulating layer of the present invention is included.

The field-effect transistor includes a gate electrode and a semiconductor layer that are isolated from each other with an insulating layer, and a source electrode and a drain electrode on the semiconductor layer, on a supporting substrate. A voltage applied to the gate electrode forms a channel of current at the interface between the semiconductor layer, which exists between the source electrode and drain electrode, and the adjoining layer. Thus, the field-effect transistor has a mechanism to control the current flowing between the source electrode and the drain electrode with an input voltage applied from the gate electrode.

Figure 1B:
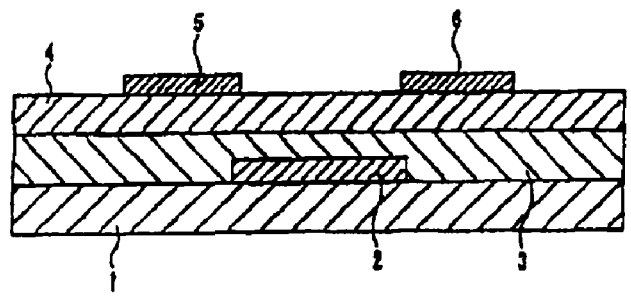
Figure 1C:
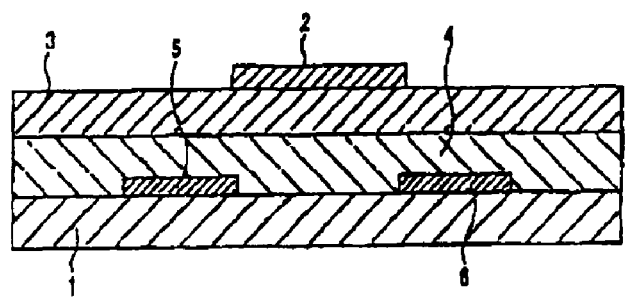
Figure 1D:
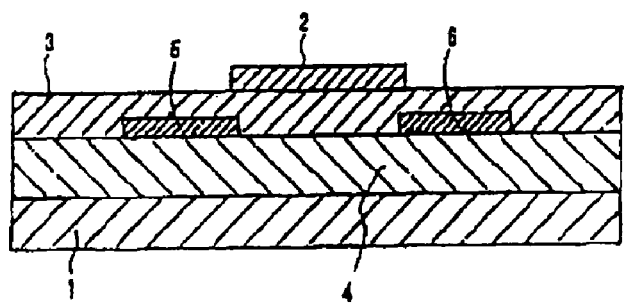

The structure of the field-effect transistor will be described with reference to the drawings. FIGS. 1(A) to 1(D) are longitudinal cross-sectional views schematically illustrating typical structures of field-effect transistors. In FIGS. 1(A) to 1(D), reference numeral 1 denotes a supporting substrate, 2 denotes a gate electrode, 3 denotes an insulating layer, 4 denotes a semiconductor layer, 5 denotes a source electrode, and 6 denotes a drain electrode. FIG. 1(A) shows a bottom-gate/bottom-contact type, FIG. 1(B) shows a bottom-gate/top-contact type, FIG. 1(C) shows a top-gate/bottom-contact type, and FIG. 1(D) shows a top-gate/top-contact type, of a field-effect transistor, respectively, but the structure of the field-effect transistor is not limited to these examples. Furthermore, although it is not shown in the drawings, each field-effect transistor may include an overcoat layer at the top in the drawing.

[Supporting Substrate]

In the field-effect transistor, the supporting substrate 1 may be a substrate that is used in conventional field-effect transistors. The supporting substrate may be made of any material that can support the field-effect transistor and, a display device and a display panel or the like thereon. Examples of the material include inorganic materials, for example, known glass, silicon oxide, and metals such as silicon; and organic materials such as various organic polymers. These materials may be used alone or in any combination of two or more kinds including inorganic material and organic material in combination. For example, an insulating layer may be formed on a surface of an inorganic substrate by coating an organic polymer. Examples of the organic polymer include polyesters, polycarbonates, polyimides, polyamides, polyethersulfones, epoxy resins, polybenzoxazoles, polybenzothiazoles, polyparabanic acid, polysilsesquioxanes, polyvinylphenols, and polyolefins. These organic polymers may be used with, for example, a filler, an additive or the like, according to need.

The thickness of the supporting substrate is not limited, but is usually 0.01 mm or more and preferably 0.05 mm or more and usually 10 mm or less and preferably 2 mm or less. In these ranges, for example, the thickness of an organic polymer substrate is preferably 0.05 to 0.1 mm, and the thickness of a glass or silicon or the like substrate is preferably 0.1 to 10 mm. In addition, the substrate may be a laminate composed of multiple layers.

[Gate Electrode]

In the field-effect transistor, the gate electrode 2 may be made of an electrically conductive material that is used in conventional field-effect transistors. Examples of the material include metals such as platinum, gold, silver, aluminum, chromium, nickel, copper, titanium, magnesium, calcium, barium, and sodium; electrically conductive metal oxides such as $InO_2$, $SnO_2$, and ITO; electrically conductive polymers such as polyaniline, polypyrrole, polythiophene, and polyacetylene; and electrically conductive composite materials containing dopants such as the electrically conductive polymers, acids such as hydrochloric acid, sulfuric acid, and sulfonic acid, Lewis acids such as $PF_6$, $AsF_5$, and $FeCl_3$, halogen atoms such as iodine, metal atoms such as sodium and potassium, and composite material having conductivity dispersed substances such as carbon black, graphite powder, and metal microparticles. These materials may be used a single kind or any combination of two or more kinds at any ratio.

The gate electrode may be formed by any process using these conductive materials. For example, the gate electrode is prepared by forming a film by a vacuum deposition, sputtering, coating, printing, or sol-gel process and then patterning the film into a desired shape, according to need. Any patterning process can be employed. Examples of the patterning process include photolithography that involves patterning with a photoresist in combination with etching such as wet-etching with an etching solution or dry-etching with a reactive plasma; printing such as inkjet printing, screen printing, offset printing, and relief printing; soft lithography such as microcontact printing; and combinations of these processes. Furthermore, the pattern may be directly formed by removing the material or by changing the electrical conductivity of the material through irradiation with energy rays such as laser beams or electron beams.

The thickness of the gate electrode is not limited, but is preferably 1 nm or more and more preferably 10 nm or more and preferably 100 nm or less and more preferably 50 nm or less.

[Insulating Layer]

The insulating layer 3 is the inventive insulating layer.

[Semiconductor Layer]

The semiconductor layer 4 can be composed of any semiconductor. From the viewpoint of effective utilization of the advantages of the present invention, organic semiconductors are preferred. The organic semiconductor may be a known π conjugated low-molecular or polymer compound. Examples include porphyrin, pentacene, copper phthalocyanine, polythiophene, oligothiophene, polyaniline, polyacetylene, polypyrrole, polyphenylene vinylene, and derivatives thereof. Among them, preferred are porphyrin, polythiophene, and oligothiophene; and more preferred is porphyrin. The field-effect transistor including a semiconductor layer containing porphyrin has advantages, i.e., increased on/off ratio and decreased threshold voltage $V_t$. The semiconductor layer may be used a single kind or any combination of two or more kinds at any ratio.

Among the semiconductors, preferred are those having a carrier density as a semiconductor layer of preferably $1\times10^7/cm^3$ or more and more preferably $1\times10^8/cm^3$ or more and preferably $1\times10^{18}/cm^3$ or less and more preferably $1\times10^{17}/cm^3$ or less where the carrier density is determined from the electron field-effect mobility, the electrical conductivity between the source electrode and the drain electrode, and the amount of charge. A less carrier density may inhibit the formation of a semiconductor, while a more carrier density may lead to an increase in off-current.

The semiconductor layer may be formed by any method. For example, an organic semiconductor layer can be formed through a known solution process such as spin-coating, stamp printing, screen printing, or a jet printing, followed by drying the coating.

The thickness of the semiconductor is not limited, but is preferably 1 nm or more and more preferably 10 nm or more and preferably 10 μm or less, more preferably 1 μm or less, and particularly preferably 500 nm or less.

[Source Electrode and Drain Electrode]

In the field-effect transistor, the source electrode 5 is an electrode to which a current flows from the outside through a wire, and the drain electrode 6 is an electrode from which a current flows to the outside through a wire. These electrodes are in contact with the semiconductor layer 4. In the field-effect transistor, the source electrode 5 and the drain electrode 6 may be formed of conventional electrically conductive materials for field-effect transistors. Examples of such materials are the same materials as those for the gate electrode 2.

The source electrode and the drain electrode may be formed of these electrically conductive materials in the same manner as in the gate electrode by film-forming and patterning, according to need. Furthermore, the pattern may be directly formed by removing the portion other than the electrode or changing the electrical conductivity of the electrode material by irradiation with energy rays such as laser beams or electron beams.

In particular, photolithography is preferred for patterning the source electrode and the drain electrode. The photolithography is roughly classified into two methods: a method of forming a film of an electrode material and then removing an area of the film where an electrode is not formed by etching; and a method of forming, patterning using resist or the like by coating at an area where an electrode is not formed, forming a film of an electrode material, and then dissolving the resist with a solvent to remove the electrode material (lift-off method). In the present invention, preferred is the former, that is, a method wherein the film of an electrode material is removed by etching at the area other than the electrode. In the method involving the etching, an insulating layer containing a polyvinyl aromatic thioether derivative is preferred from the point of resistance to the etching liquid.

The thickness of each of the source electrode and the drain electrode is not limited, but is preferably 1 nm or more and particularly preferably 10 nm or more and preferably 100 nm or less and particularly preferably 50 nm or less.

The distance (channel length L) between the source electrode and the drain electrode is not limited, but is preferably 100 μm or less and particularly preferably 50 μm or less. The channel width W is preferably 2000 μm or less and particularly preferably 500 μm or less. In addition, the L/W is preferably 1 or less and particularly preferably 0.1 or less.

[Overcoat Layer]

In the field-effect transistor, examples of the material of the overcoat layer include organic polymers such as polystyrene, acrylic resins, polyvinyl alcohols, polyolefins, polyimides, polyurethanes, and epoxy resins; and inorganic materials such as metal oxides and metal nitrides, such as silicon oxide, aluminum oxide, and silicon nitride. These materials may be used a single kind or any combination of two or more kinds at any ratio.

The overcoat layer may be formed by any known method without limitation. For example, in an overcoat layer of an organic polymer, the organic polymer layer may be formed by application of a solution of the polymer and drying the coating layer or may be formed by application of a monomer corresponding to the polymer and then polymerizing the monomer. Furthermore, after the formation of the film, post-treatment such as cross-linking may be carried out. In an overcoat layer of an inorganic material, the overcoat layer may be formed by, for example, sputtering, deposition, or a solution process such as a sol-gel process. The overcoat layer may be composed of multiple films to enhance the effect.

[Other Layer]

The field-effect transistor may include one or more layers other than the supporting substrate 1, the gate electrode 2, the insulating layer 3, the semiconductor layer 4, the source electrode 5, the drain electrode 6, and the overcoat layer. Such a layer may be disposed at any position that does not inhibit the function of the field-effect transistor.

[III. Others]

Among the polymer insulating substances described in the section of the polymer insulating substance according to the present invention, polyvinylthiophenol having at least the vinylthiophenol/derivative unit and either or both of the crosslinkable vinyl monomer unit and the heat-resistant vinyl monomer unit is novel polymer that has not been hitherto known. This novel polymer has excellent characteristics as described above and are expected to be applied to various purposes in addition to the application to the insulating layer of the present invention. Therefore, polyvinylthiophenol having at least the vinylthiophenol/derivative unit and repeating units derived from crosslinkable vinyl monomer, and polyvinylthiophenol having at least the vinylthiophenol/derivative unit and repeating units derived from the heat-resistant vinyl monomer are also included within the technical scope of the present invention.

EXAMPLES

The present invention will now be described in detail with reference to Examples, but these Examples are merely illustrative of the present invention, and the present invention is not limited to the following Examples and can be modified without departing from the scope of the invention.

Synthetic Example 1

Synthesis of p-vinylbenzenethiol

Under a nitrogen atmosphere, 1.64 g of Mg powder was dispersed in 53 mL of tetrahydrofuran (THF) at room temperature, and 8 mL of 4-bromostyrene (manufactured by Aldrich) was slowly dropwise added thereto. In order to prevent an increase in reaction temperature, the reaction liquid was gradually cooled to −15° C. Thus, a Grignard reagent was prepared. At this temperature, sulfur powder (manufactured by Aldrich) was poured in the reaction liquid, and the temperature of the resulting mixture was gradually increased to 0° C. over 3 hours. After 3 hours, an aqueous 1N NaOH solution was added to the reaction liquid, followed by stirring. This reaction liquid was filtered and was extracted with ether. The aqueous layer was collected and concentrated under reduced pressure at room temperature. To this aqueous layer was gradually added 1N HCl to adjust the pH to 6.5. The resulting light yellow aqueous layer was extracted with benzene, and the organic layer was dried and concentrated over sodium sulfate to give the target compound, p-vinylbenzenethiol.

The resulting product was identified by $^1$H-NMR and GC-MS analyses. The results are as follows:

$^1$H-NMR: 3.45 (—SH, s, 1H), 7.02-7.38 (—C$_6$H$_4$—, m, 4H)

GC-MS: m/e=136.

Figure 2:
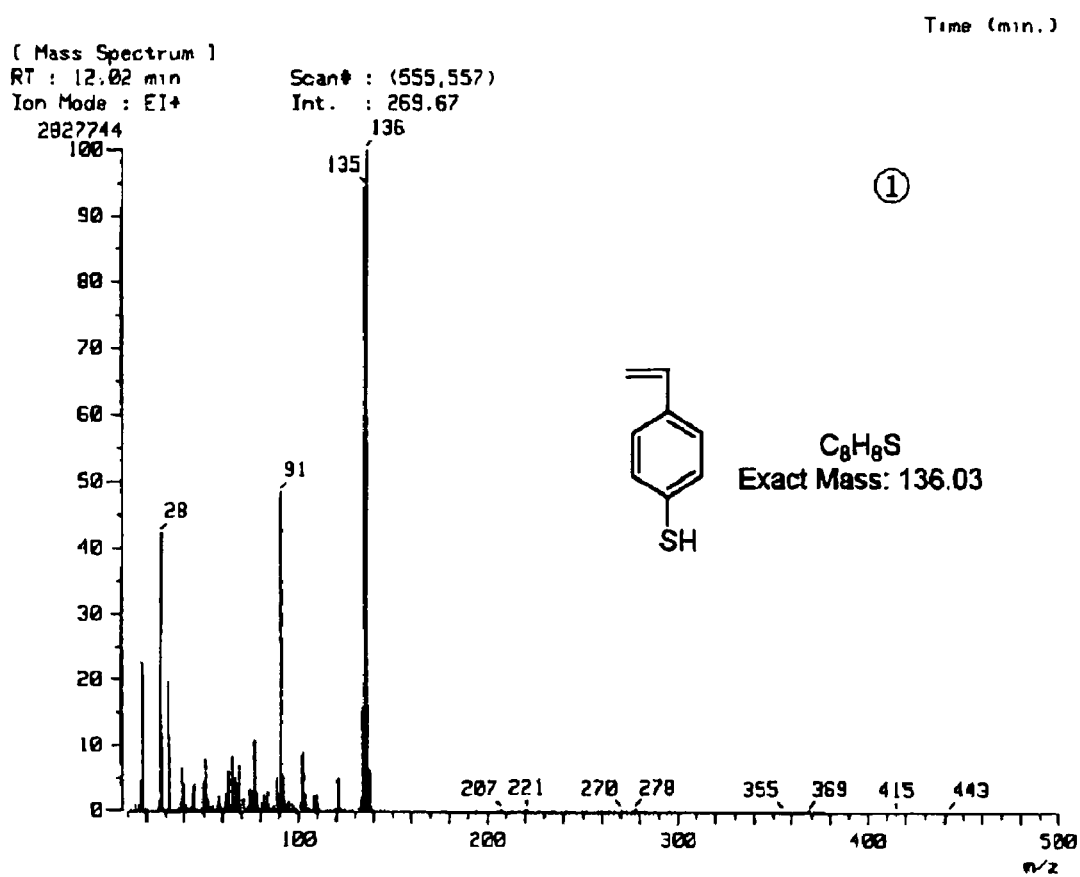
FIG. 2 is a diagram showing a mass spectrum of p-vinylbenzenethiol prepared by Synthetic Example 1.

FIG. 2 shows a mass spectrum of p-vinylbenzenethiol prepared in Synthetic Example 1.

Synthetic Example 2

Protection of Thiol with an Acetyl Group

Under a nitrogen atmosphere, 2.7 g of p-vinylbenzenethiol prepared in Synthetic Example 1 was dissolved in 300 mL of THF at −5° C., and 10 mL of pyridine was added thereto as a deoxidizing agent. The resulting mixture was sufficiently stirred for 1 hour, and then 3 g of acetyl chloride was slowly dropwise added thereto. After completion of the dropping, the mixture was stirred for 1 hour to precipitate pyridine hydrochloride. The pyridine hydrochloride was removed by filtration, and the filtrate was concentrated under reduced pressure at low temperature and then extracted with benzene and water. The organic layer was concentrated under reduced pressure at low temperature to give a light yellow liquid. This liquid was purified by alumina column chromatography (methylene chloride) to give the target compound, p-vinylbenzenethiol with an acetyl protection group.

The resulting product was identified by $^1$H-NMR and GC-MS analyses. The results are as follows:

$^1$H-NMR: 7.02-7.38 (—$C_6H_4$—, m, 4H)

GC-MS: m/e=178.

Synthetic Example 3

Mercapto Group-Containing Polymer A (Copolymer)

A 1:1 mixture of p-vinylbenzenethiol with an acetyl protection group (1.8 g) purified in Synthetic Example 2 and vinyl cinnamate (1.7 g, manufactured by Aldrich) was dissolved in THF into a concentration of 10 wt % under light-shielding conditions in nitrogen. A polymerization initiator, 2,2'-azobis-isobutyronitrile (manufactured by Kishida Chemical), was added thereto at a ratio of 0.01 mol % to the monomer. The resulting mixture was heated to reflux for 8 hours. After the completion of the reaction, the reaction liquid was poured in methanol for reprecipitation to give a white solid polymer. The number-average molecular weight measured by GPC (polystyrene standard) was 30000 and the weight-average molecular weight was 90000. The acetyl group of the resulting polymer was deprotected by redissolving the polymer in a solution mixture of an aqueous sodium hydroxide solution and THF and reprecipitating the polymer in an aqueous 1N hydrochloric acid solution. The deprotected polymer was dried under reduced pressure to give polymer A represented by the following structural formula. In the structural formula, parentheses represent repeating units, and the binding order and the proportion of these repeating units in the polymer are not limited to those shown in the structural formula.

[Formula 22]

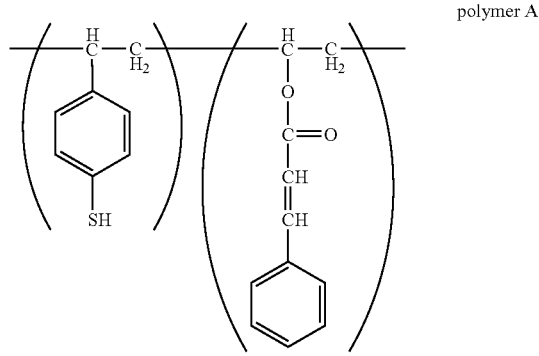

polymer A

Synthetic Example 4

Mercapto Group-Containing Polymer B (Ternary Copolymer)

A 2:1:1 mixture of p-vinylbenzenethiol with an acetyl protection group (1.8 g) purified in Synthetic Example 2, vinyl cinnamate (0.9 g, manufactured by Aldrich), and maleic anhydride (0.5 g, manufactured by Aldrich) was dissolved in THF into a concentration of 10 wt % under light-shielding conditions in nitrogen. A polymerization initiator, 2,2'-azobis-isobutyronitrile (manufactured by Kishida Chemical), was added thereto at a ratio of 0.01 mol % to the monomer. The resulting mixture was heated to reflux for 8 hours. After the completion of the reaction, the reaction liquid was poured in methanol to give precipitation of a white solid polymer. This polymer was dissolved in 200 mL of N-methylpyrrolidone, and 100 mL of aniline was added thereto under light-shielding and nitrogen atmosphere conditions. The resulting mixture was heated to reflux for 3 hours. After the completion of the reaction, reprecipitation and deprotection of the acetyl group were simultaneously carried out in an aqueous 1N hydrochloric acid solution to give a white solid polymer. The number-average molecular weight measured by GPC (polystyrene standard) was 20000 and the weight-average molecular weight was 70000. The acetyl group of the resulting polymer was deprotected by redissolving the polymer in a solution mixture of an aqueous sodium hydroxide solution and THF and reprecipitating the polymer in an aqueous 1N hydrochloric acid solution. The deprotected polymer was dried under reduced pressure to give polymer B represented by the following structural formula. In the structural formula, parentheses represent repeating units, and the binding order and the proportion of these repeating units in the polymer are not limited to those shown in the structural formula.

[Formula 23]

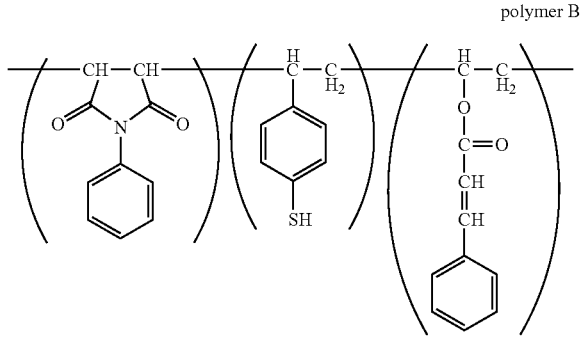

polymer B

Synthetic Example 5

Mercapto Group-Containing Polymer C (Homopolymer)

p-Vinylbenzenethiol with an acetyl protection group (1.8 g) purified in Synthetic Example 2 was dissolved in THF into a concentration of 10 wt % in nitrogen. A polymerization initiator, 2,2'-azobis-isobutyronitrile (manufactured by Kishida Chemical), was added thereto at a ratio of 0.01 mol % to the monomer. The resulting mixture was heated to reflux for 8 hours. After the completion of the reaction, the reaction liquid was poured in methanol to give precipitation of a white solid polymer. The number-average molecular weight measured by GPC (polystyrene standard) was 29000 and the weight-average molecular weight was 88000. The acetyl group of the resulting polymer was deprotected by redissolving the polymer in a solution mixture of an aqueous sodium hydroxide solution and THF and reprecipitating the polymer in an aqueous 1N hydrochloric acid solution. The deprotected polymer was dried under reduced pressure to give polymer C represented by the following structural formula.

[Formula 24]

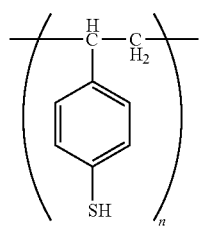

polymer C

Synthetic Example 6

Protection of Thiol with a Methyl Group

Under a nitrogen atmosphere, 0.9 g of p-vinylbenzenethiol prepared in Synthetic Example 1 was dissolved in 100 mL of THF at −5° C., and 50 mL of pyridine was added thereto as a deoxidizing agent. The resulting mixture was sufficiently stirred for 1 hour, and then 1 g of methane iodide was slowly dropwise added thereto. After completion of the dropping, the mixture was stirred at low temperature for 2 hours. After the completion of the reaction, the reaction liquid was concentrated under reduced pressure at low temperature and then extracted with diethylether and water. The organic layer was concentrated under reduced pressure at low temperature to give a light yellow liquid. This liquid was purified by alumina column chromatography (methylene chloride) to give the target compound, p-vinylbenzenethiol with a methyl protection group.

The resulting product was identified by $^1$H-NMR and GC-MS analyses. The results are as follows:
$^1$H-NMR: 7.00-7.34 (—$C_6H_4$—, m, 4H)
GC-MS: m/e=151.

Synthetic Example 7

Mercapto Group-Containing Polymer D (Copolymer)

A 1:1 mixture of p-vinylbenzenethiol with a methyl protection group (1.5 g) purified in Synthetic Example 6 and vinyl acetate (0.87 g, manufactured by Aldrich) was dissolved in THF into a concentration of 10 wt % in nitrogen. A polymerization initiator, 2,2'-azobis-isobutyronitrile (manufactured by Kishida Chemical), was added thereto at a ratio of 0.01 mol % to the monomer. The resulting mixture was heated to reflux for 8 hours. After the completion of the reaction, the reaction liquid was poured in methanol for reprecipitation to give a white solid polymer. This white polymer was dissolved in 100 mL of pyridine, and 1.5 g of cinnamic acid chloride was slowly dropwise added thereto. After the completion of the dropping, the mixture was stirred at low temperature for 2 hours to precipitate pyridine hydrochloride. The pyridine hydrochloride was removed by filtration, and the filtrate was poured in methanol for reprecipitating a white solid of polymer D represented by the structural formula shown below. In the structural formula, parentheses represent repeating units, and the binding order and the proportion of these repeating units in the polymer are not limited to those shown in the structural formula. The number-average molecular weight measured by GPC (polystyrene standard) was 30000 and the weight-average molecular weight was 90000.

[Formula 25]

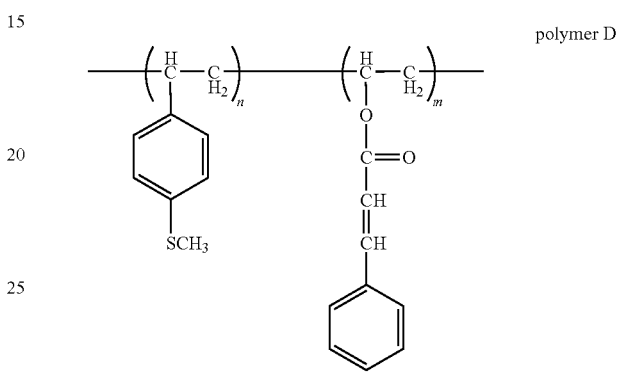

polymer D

Example 1

A pattern was formed on an ITO glass plate (2.5 cm×2.5 cm, manufactured by Houwa Sangyo) using a photoresist ("ZPN1100", manufactured by Zeon Corp.). Unnecessary ITO was removed by etching with a 1 normality of hydrogen chloride aqueous solution containing 1 wt % iron (II) chloride, followed by washing to form a gate electrode. Then, an N-methylpyrrolidone solution containing 10 wt % polymer A prepared in Synthetic Example 3 (which was subjected to pressure filtration through a PTFE filter of 0.2 μm) was spin-coated on the gate electrode at a rate of 2000 rpm to form a film with a thickness of 3000 angstroms. This film was irradiated with ultraviolet light using an ultraviolet exposure device provided with an ultrahigh pressure mercury lamp for a photo-crosslinking reaction of the cinnamic acid moiety to be insolubilized to solvents. Thus, a gate-insulating layer was formed. Subsequently, patterning for forming a source electrode and a drain electrode was conducted on this gate-insulating layer by photolithography (Nagase ChemteX Corp.: positive type lift-off resist NPR9700T), and chromium and gold were deposited so as to have thicknesses of 50 angstroms and 1000 angstroms, respectively, to form the source electrode and the drain electrode with a distance (L) of 10 μm and a width (W) of 500 μm. Furthermore, chloroform solution containing 0.7 wt % porphyrin compound having a structure shown below was spin-coated thereon, followed by heating at 180° C. for 10 minutes to convert the porphyrin compound to tetrabenzoporphyrin. Thus, a bottom-gate/bottom-contact type field-effect transistor shown in FIG. 1(A) including a semiconductor layer of tetrabenzoporphyrin was produced. All the layers and the electrodes were formed in a nitrogen atmosphere.

[Formula 26]

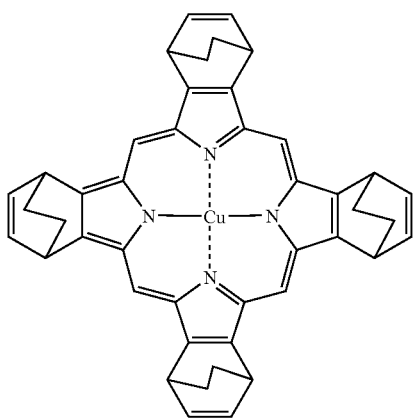

The mobility μ, threshold voltage $V_t$, and on/off ratio of the field-effect transistor produced above were measured using a semiconductor parameter analyzer "4155C" manufactured by Agilent Technology according to the procedure shown below. The mobility μ was 0.13 cm²/V·s, the threshold voltage $V_t$ was −3.5 V, and the on/off ratio was $3\times10^5$.

The electrical conductivity of the insulating layer was measured at the overlapping portion of the gate electrode and the source/drain electrodes. The electrical conductivity was $1\times10^{-12}$ S/cm or less.

[Measurement of Mobility μ and Threshold Voltage $V_t$]

The relationship among the current $I_d$ caused by the voltage $V_d$ applied between the source electrode and the drain electrode, the voltage $V_g$ applied to the source electrode and the gate electrode, the threshold voltage $V_t$, the electrostatic capacitance $C_i$ of the gate-insulating layer per unit area, the distance L between the source electrode and the drain electrode, the width W, and the mobility p of the semiconductor layer can be expressed by the following equations (1) and (2). Changes in $I_d$ with variable $V_g$ values were measured. The mobility μ was determined from the gradient in a graph obtained by plotting $I_d^{1/2}$ versus $V_g$, and the threshold voltage $V_t$ was determined from the intercept $I_d$ of the graph.

$$\text{For } V_d < (V_g - V_t), I_d = \mu C_i (W/L)[(V_g - V_t) V_d - (V_d^2/2)] \quad (1)$$

$$\text{For } V_d > V_g, I_d = (1/2) \mu C_i (W/L)(V_g - V_t)^2 \quad (2)$$

[On/Off Ratio]

The voltage $V_d$ applied between the source electrode and the drain electrode was fixed to −30 V, and the current $I_d$(−50 V) and the current $I_d$(+30 V) flowing from the source electrode to the drain electrode were measured when a voltage $V_g$ of −50 V and +30 V were applied, respectively, to the source electrode and the gate electrode. The on/off ratio was calculated based on the ratio, $I_d$(−50 V)/$I_d$(+30 V).

Example 2

A bottom-gate/bottom-contact type field-effect transistor shown in FIG. 1(A) was produced as in Example 1 except that polymer B prepared in Synthetic Example 4 was used instead of polymer A prepared in Synthetic Example 3.

The mobility μ, threshold voltage $V_t$, and on/off ratio of the field-effect transistor produced above were measured as in Example 1. The mobility μ was 0.3 cm²/V·s, the threshold voltage $V_t$ was 5 V, and the on/off ratio was $2.3\times10^5$.

The electrical conductivity of the insulating layer was measured at the overlapping portion of the gate electrode and the source/drain electrodes. The electrical conductivity was $1\times10^{-12}$ S/cm or less.

Example 3

A pattern was formed on an ITO glass plate (2.5 cm×2.5 cm, manufactured by Houwa Sangyo) using a photoresist ("ZPN1100", manufactured by Zeon Corp.). Unnecessary ITO was removed by etching with a 1 normality of hydrogen chloride aqueous solution containing 1 wt % iron(II) chloride, followed by washing to form a gate electrode. Then, an N-methylpyrrolidone solution containing 10 wt % polymer C prepared in Synthetic Example 5 (which was subjected to pressure filtration through a PTFE filter of 0.2 μm) was spin-coated on the gate electrode at a rate of 2000 rpm to form a film (gate-insulating layer) with a thickness of 3000 angstroms. Subsequently, patterning for forming a source electrode and a drain electrode was conducted on this gate-insulating layer by photolithography (Nagase ChemteX Corp.: positive lift-off resist NPR9700T), and chromium and gold were deposited so as to have thicknesses of 50 angstroms and 1000 angstroms, respectively, to form a source electrode and a drain electrode with a distance (L) of 10 μm and a width (W) of 500 μm. Furthermore, a chloroform solution containing 1 wt % 3-hexylpolythiophene manufactured by Aldrich was spin-coated thereon to form a semiconductor layer. Thereby, a bottom-gate/bottom-contact type field-effect transistor shown in FIG. 1(A) was produced. All the layers and the electrodes were formed in a nitrogen atmosphere.

The mobility μ, threshold voltage $V_t$, and on/off ratio of the field-effect transistor produced above were measured as in Example 1. The mobility μ was 0.05 cm²/V·s, the threshold voltage $V_t$ was 6 V, and the on/off ratio was $2.3\times10^4$.

The electrical conductivity of the insulating layer was measured at the overlapping portion of the gate electrode and the source/drain electrodes. The electrical conductivity was $1\times10^{-12}$ S/cm or less.

Example 4

[Production of Gate Electrode]

A Cr film (thickness: 30 nm) was formed on a glass wafer, Eagle 2000 manufactured by Corning, by electron beam deposition with a vacuum vapor deposition apparatus, EX-400 available from Ulvac.

Then, a pattern was formed using a positive resist, OFPR-800LB available from Tokyo Ouka, by spin coating at 1500 rpm for 20 seconds and then prebaking at 80° C. for 10 minutes and etching with a Cr etching solution available from Mitsubishi Chemical for one minute and 20 seconds to one minute and 30 seconds.

After the completion of the etching, the gate electrode formed was ultrasonically washed with N,N-dimethylformamide (DMF), acetone, Extran, pure water, and isopropanol (IPA) in this order for 30 minutes each, and then dried at 140° C. for 10 minutes.

[Production of Gate-Insulating Layer]

An insulating layer of 500 nm was formed by spin-coating a 10 wt % polymer D solution in cyclohexanone (which was subjected to pressure filtration through a PTFE filter of 0.2 μm) on the wafer at a rate of 1500 rpm for 120 seconds.

This insulating layer was patterned by irradiation with UV at a dose of 1 J/cm², development with an organic solvent developing solution for one minute and 30 seconds, and then rinsed in acetone for 30 seconds.

[Production of Source/Drain Electrodes]

Films of Cr (thickness: 5 nm) and Au (thickness: 100 nm) were formed on the entire surface of the insulating layer of polymer D by vacuum deposition with a vacuum vapor deposition apparatus, EX-400 available from Ulvac.

Then, a pattern was formed with a positive resist, OFPR-800LB available from Tokyo Ouka, by spin coating at 1500 rpm for 20 seconds and then prebaking at 80° C. for 10 minutes and etching with an Au etching solution for one minute and five seconds, a Cr etching solution for 15 seconds, and again the Au etching solution for five seconds. These etching solutions were available from Mitsubishi Chemical.

Then, the resulting electrodes were immersed in aqueous ammonia for one minute for neutralization.

After washing with DMF, acetone, and IPA in this order and drying at 120° C. for one hour, a polymer-gate-insulating layer element including source/drain electrodes was produced.

[Production of Semiconductor Layer]

A chloroform solution containing 0.7 wt % porphyrin compound used in Example 1 was spin-coated on the polymer-gate-insulating layer element including electrodes produced above, followed by heating at 180° C. for 10 minutes to convert the porphyrin compound to tetrabenzoporphyrin. Thus, a bottom-gate/bottom-contact type field-effect transistor shown in FIG. 1(A) including a semiconductor layer of tetrabenzoporphyrin was produced. All the layers and the electrodes were formed in a nitrogen atmosphere.

The mobility $\mu$, threshold voltage $V_t$, and on/off ratio of the thus produced field-effect transistor including an insulating layer of polymer D were measured as in Example 1. The mobility $\mu$ was 0.5 cm$^2$/V·s, the threshold voltage $V_t$ was −1 V, and the on/off ratio was 4.3×10$^4$.

The electrical conductivity of the insulating layer was measured at the overlapping portion of the gate electrode and the source/drain electrodes. The electrical conductivity was 1×10$^{-12}$ S/cm or less.

Example 5

[Production of Gate Electrode]

A gate electrode was produced on a wafer as in Example 4.

[Production of Gate-Insulating Layer]

An insulating layer was formed as in Example 4 except that polymer A was used instead of polymer D.

[Production of Source/Drain Electrodes]

An Au film (thickness: 100 nm) was formed on the entire surface of the insulating layer of polymer A produced above by vacuum deposition with a vacuum vapor deposition apparatus, EX-400 available from Ulvac.

Since the insulating layer of polymer A has thiol groups on the surface, Cr in the adhesion layer is not necessary. This is advantageous compared to Example 4.

Then, as in Example 4, a polymer-gate-insulating layer element including source/drain electrodes was produced through resist patterning, etching, neutralization, washing, and drying.

[Production of Semiconductor Layer]

A semiconductor layer was produced on the polymer-gate-insulating layer element with electrodes produced above as in Example 4 to produce a bottom-gate/bottom-contact type field-effect transistor shown in FIG. 1(A).

The mobility $\mu$, threshold voltage $V_t$, and on/off ratio of the field-effect transistor including an insulating layer of polymer A were measured as in Example 1. The mobility $\mu$ was 1.2 cm$^2$/V·s, the threshold voltage $V_t$ was −4.7 V, and the on/off ratio was 1.3×10$^5$.

The electrical conductivity of the insulating layer was measured at the overlapping portion of the gate electrode and the source/drain electrodes. The electrical conductivity was 1×10$^{-12}$ S/cm or less.

Comparative Example 1

Polyvinylphenol (PVP: Mw=20000 (GPC method)) manufactured by Aldrich and poly(melamine-co-formaldehyde) methacrylate (manufactured by Aldrich) serving as a cross-linking agent were mixed at a ratio of 4:1 (weight ratio). This mixture was dissolved in tetrahydrofuran (THF) at a concentration of 5 wt %, followed by filtration through a filter (PTFE) of 0.45 μm. This PVP solution was applied on a substrate as in Example 3 and spin-coated at 3000 rpm for 120 seconds. Then, a transistor device was produced as in Example 3 except that the insulating layer was a thermally cross-linked PVP film produced by heat treatment at 120° C. for three minutes. The transistor device was evaluated as in Example 3.

The mobility $\mu$, threshold voltage $V_t$, and on/off ratio of the field-effect transistor produced above were measured as in Example 1. The mobility $\mu$ was 0.04 cm$^2$/V·s, the threshold voltage $V_t$ was 22 V, and the on/off ratio was 4.7×10$^3$.

The electrical conductivity of the insulating layer was measured at the overlapping portion of the gate electrode and the source/drain electrodes. The electrical conductivity was 1×10$^{-12}$ S/cm or less.

CONCLUSION

The results of Examples 1 to 5 and Comparative Example 1 elucidate that the device characteristics of transistors can be improved by the use of materials having repeating units represented by Formula (A) in gate-insulating layers. Furthermore, since the device characteristics in Examples 1 and 2 were further improved than that in Example 3, it has been confirmed that device characteristics can be still further improved when the polymer insulating substance of the present invention has a crosslinkable vinyl monomer unit and a heat-resistant vinyl polymer unit.

INDUSTRIAL APPLICABILITY

The present invention can be applied to various industrial fields, for example, in devices including insulating layers, such as electronic devices. Moreover, the present invention is suitable for field-effect transistors.

The field-effect transistors can be used as switching devices for display pixels in an active matrix of a display. This utilizes that a current flowing between the source electrode and the drain electrode can be switched with a voltage applied to the gate electrode and displays images at high speed and with high contrast by switching on a certain display device only when a voltage is applied or a current is supplied to the device and switching off the circuit of the device in other period of time. Examples of the display devices where the present invention is applied include liquid crystal display devices, polymer dispersed liquid crystal display devices, electrophoresis display devices, electroluminescence devices, electrochromic devices or the like.

In particular, the devices of field-effect transistors can be produced at low temperature. Accordingly, a substrate that is not resistive to high-temperature treatment, such as plastic and paper, can be also used. In addition, since the elements can be produced by coating or printing, the field-effect transistor can be also suitable for large-sized displays. Furthermore, the field-effect transistors are advantageous as devices capable of energy saving and low-cost processing, comparable to switching devices for pixels including silicon semiconductors used in a conventional active matrix.

Furthermore, digital devices and analog devices can be produced by integration of transistors. Examples thereof include logic circuits such as AND, OR, NAND, and NOT, memory devices, oscillator devices, and amplifying devices. In addition, IC cards and IC tags can be produced by combining such devices.

Furthermore, organic semiconductors can largely vary characteristics by stimulation from the outside, such as a gas, a chemical material, or temperature, and thereby can be applied to sensors. For example, a chemical material can be qualitatively or quantitatively detected by measuring the amount of a change that is caused by a contact with a gas or a liquid.

The present invention has been described in detail with specific embodiments, but it is obvious to those skilled in the art that various modifications are possible without departing from the spirit and the scope of the present invention.

The present application is based on Japanese Patent Application (Patent Application No. 2006-213014) filed on Aug. 4, 2006 and Japanese Patent Application (Patent Application No. 2007-201410) filed on Aug. 2, 2007, the entire contents of which are incorporated by reference.

The invention claimed is:

1. An insulating layer comprising:
a polymer comprising at least repeating units of Formula (A):

wherein
$R^a$ represents a direct bond
Ar represents a divalent aromatic group optionally having a substituent, and
$R^b$ represents a hydrogen atom, a fluorine atom, or a univalent organic group.

2. The insulating layer according to claim 1, wherein Ar is a hydrocarbon aromatic ring optionally having a substituent.

3. The insulating layer according to claim 1, wherein $R^b$ is a hydrogen atom or a linear or branched hydrocarbon group.

4. The insulating layer according to claim 1, wherein the repeating unit of Formula (A) is at least one of vinylthiophenol and a vinylthiophenol derivative.

5. The insulating layer according to claim 1, wherein the polymer further comprises repeating units of a crosslinkable vinyl monomer.

6. The insulation layer according to claim 5, wherein the crosslinkable vinyl monomer comprises a side chain carbon-carbon double bond capable of dimerization by irradiation with light or heat.

7. The insulation layer according to claim 6, wherein the crosslinkable vinyl monomer is at least one of vinyl 3-phenylpropenoate and vinyl 6-phenyl-2,4-pentadienoate.

8. The insulating layer according to claim 5, wherein a mole fraction of the crosslinkable vinyl monomer in the polymer is from 0.1 to 0.9.

9. The insulating layer according to claim 1, wherein the polymer further comprises repeating units of a heat-resistant vinyl monomer.

10. The insulating layer according to claim 1, wherein an electrical conductivity of the insulating layer is $1 \times 10^{-12}$ S/cm or less.

11. An electronic device comprising an insulating layer according to claim 1.

12. A field-effect transistor comprising an insulating layer according to claim 1.

13. The field-effect transistor according to claim 12, further comprising a semiconductor layer containing porphyrin, a source electrode, a drain electrode, and a gate electrode.

14. The insulating layer according to claim 1, wherein $R^b$ is a univalent organic group selected from the group consisting of $CH_3-$, $CF_3-$, $CH_3(CH_2)_n-$ wherein n is an integer of 1 or more and 23 or less and a C-6 alkyl carboxyl group.

15. The insulating layer according to claim 1, wherein the optional substituent of the divalent aromatic group is at least one selected from the group consisting of a halogen, a linear, branched, or cyclic alkyl group having 1 or more and 24 or less carbon atoms, a fluorine substituted linear, branched, or cyclic alkyl group having 1 or more and 24 or less carbon atoms, an aryl group, a cyano group, a carboxyl group, an alkoxy group, a nitro groups, an amino group, a sulfonic acid group and a hydroxyl group.

16. The insulating layer according to claim 1, wherein a mole fraction of the repeating unit of Formula (A) in the polymer is 0.1 or greater.

17. A polymer, comprising:
a repeating unit of a crosslinkable vinyl monomer; and
at least one different repeating unit selected from the group consisting of a repeating unit of a vinylthiophenol, and a repeating unit of a vinylthiophenol derivative.

18. A polymer, comprising:
a repeating unit of a heat-resistant vinyl monomer; and
at least one different repeating unit selected from the group consisting of a repeating unit of vinylthiophenol, and a repeating unit of a vinylthiophenol derivative.

* * * * *